(12) United States Patent
Sakamoto

(10) Patent No.: US 10,116,117 B2
(45) Date of Patent: Oct. 30, 2018

(54) LD MODULE

(71) Applicant: FUJIKURA LTD., Tokyo (JP)

(72) Inventor: Shinichi Sakamoto, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/448,908

(22) Filed: Mar. 3, 2017

(65) Prior Publication Data

US 2017/0179683 A1  Jun. 22, 2017

Related U.S. Application Data

(63) Continuation of application No. PCT/JP2015/076042, filed on Sep. 14, 2015.

(30) Foreign Application Priority Data

Sep. 12, 2014 (JP) .................................. 2014-187001

(51) Int. Cl.
*H01S 5/022* (2006.01)

(52) U.S. Cl.
CPC ...... *H01S 5/02252* (2013.01); *H01S 5/02284* (2013.01); *H01S 5/02288* (2013.01)

(58) Field of Classification Search
CPC ............. H01S 5/02252; H01S 5/02284; H01S 5/02288
See application file for complete search history.

(56) References Cited

U.S. PATENT DOCUMENTS 5,185,626 A  2/1993 Kinney et al.
5,815,626 A  9/1998 Kuba et al.
(Continued)

FOREIGN PATENT DOCUMENTS

JP  8-167754 A  6/1996
JP  9-162501 A  6/1997
(Continued)

OTHER PUBLICATIONS

Gilly, J. et al, "High Power Broad Area Lasers Optimized for Fiber Laser Pumping", SPIE-International Society for Optical Engineering Proceedings, Jan. 2012, vol. 8241, p. 82410T; cited in Extended (supplementary) European Search Report.
(Continued)

*Primary Examiner* — Dung Nguyen
(74) *Attorney, Agent, or Firm* — Westerman, Hattori, Daniels & Adrian, LLP

(57) ABSTRACT

Emitter width of an LD is set greater than a diameter, of a core, in an entrance end surface of an optical fiber. An optical system provided between the LD and the optical fiber causes a diameter, of laser beam, in the entrance end surface of the optical fiber to become smaller than the diameter, of the core, in the entrance end surface of the optical fiber. The LD is configured so that a beam parameter product of the laser beam emitted from the LD shows a local minimal value which changes in accordance with the emitter width of the LD, and which is equal to or smaller than a beam parameter product of the optical fiber. The emitter width of the LD is set so that the beam parameter product of the laser beam emitted from the LD is equal to or smaller than that of the optical fiber.

9 Claims, 5 Drawing Sheets

(56) References Cited

U.S. PATENT DOCUMENTS

| | | | |
|---|---|---|---|
| 2006/0238738 A1* | 10/2006 | Ishikawa | G03F 7/7005 355/67 |
| 2007/0195850 A1 | 8/2007 | Schluter et al. | |
| 2011/0211608 A1 | 9/2011 | Fujimoto et al. | |
| 2015/0280404 A1 | 10/2015 | Kasai et al. | |

FOREIGN PATENT DOCUMENTS

| | | | |
|---|---|---|---|
| JP | 11-337866 A | 12/1999 | |
| JP | 2000-98190 A | 4/2000 | |
| JP | 2000-241659 A | 9/2000 | |
| JP | 2014-126852 A | 7/2014 | |
| WO | 2010/050071 A1 | 5/2010 | |

OTHER PUBLICATIONS

Platz, R. et al, "940nm Broad Area Diode Lasers Optimized for High Pulse-Power Fiber Coupled Applications", IEEE Photonics Technology Letters, 2013, vol. 26, No. 6, pp. 625-628; cited in Extended (supplementary) European Search Report.

Extended (supplementary) European Search Report dated Jul. 17, 2017, issued in counterpart European Application No. 15840866.6. (11 pages).

Notice of Allowance dated May 9, 2017, issued in counterpart Japanese Application No. 2016-085486, with English translation. (4 pages).

Japanes Office Action dated Aug. 4, 2015, issued in counterpart Japanese Patent Application No. 2014-187001 (2 pages).

Japanese Office Action dated Dec. 8, 2015, issued in counterpart Japanese Patent Application No. 2014-187001 (2 pages).

Japanese Notice of Allowance issued in counterpart Japanese Patent Application No. 2014-187001 (1 page).

International Search Report dated Nov. 24, 2015, issued in counterpart International Application No. PCT/JP2015/076042 (2 pages).

* cited by examiner

LD MODULE

CROSS-REFERENCE TO RELATED APPLICATIONS

This application is a Continuation of PCT International Application No. PCT/JP2015/076042 filed in Japan on Sep. 14, 2015, which claims the benefit of Patent Application No. 2014-187001 filed in Japan on Sep. 12, 2014, the entire contents of which are hereby incorporated by reference.

TECHNICAL FIELD

The present invention relates to an LD module which includes a semiconductor laser device and an optical fiber.

BACKGROUND ART

LD modules are in wide use, each of which includes a semiconductor laser device (hereinafter referred to as an "LD") and an optical fiber. Such an LD module causes a laser beam, emitted from the LD, to be coupled with the optical fiber. In recent years, development of high-output LD modules has been advanced by (i) increasing the number of LDs and/or (ii) achieving high output of each of the LDs.

For example, techniques disclosed in Patent Literatures 1 and 2 are each known as a technique for enhancing a reliability of an LD which achieved high output. According to the technique disclosed in Patent Literature 1, catastrophic optical damages (CODs) are prevented by treating an end surface of an LD with a treatment solution having a function of preventing a surface level from being generated. According to the technique disclosed in Patent Literature 2, an optical confinement coefficient ($\Gamma$ factor) of an active layer is reduced by dispersing a light density, in a vertical direction, of the active layer.

CITATION LIST

Patent Literature

[Patent Literature 1]
Japanese Patent Application Publication Tokukaihei No. 9-162501 (Publication Date: Jun. 20, 1997)
[Patent Literature 2]
International Publication No. WO 2010/050071 (Publication Date: May 6, 2010)

SUMMARY OF INVENTION

Technical Problem

In order to prevent an accidental breakdown of an LD, i.e., in order to enhance a reliability of an LD, a resonator length of the LD is typically increased, in addition to employing the technique(s) disclosed in Patent Literatures 1 and/or 2. An increase in resonator length of an LD actually enhances a heat-dissipating property of the LD, and reduces, in its active layer, a loss of light per unit volume. This causes a temperature to be lowered in the active layer. Note that the technique disclosed in Patent Literature 2 can be more effectively applied to an LD having a greater resonator length.

However, an increase in resonator length of an LD causes a decrease in electrooptic conversion efficiency of the LD. Thus, an increase in resonator length of an LD provided in an LD module leads to a decrease in efficiency of the LD module. The following description will discuss why an increase in resonator length of an LD leads to a decrease in electrooptic conversion efficiency of the LD.

In order to realize laser oscillation in an LD, the following equation (1) needs to be satisfied.

$$g = \alpha_{wg} + \alpha_m \tag{1}$$

where g is a gain coefficient, $\alpha_{wg}$ is a waveguide loss, and $\alpha_m$ is a mirror loss.

The mirror loss $\alpha_m$ can be represented by the following equation (2).

$$\alpha_m = \ln(1/(R1 \times R2))/2L \tag{2}$$

where R1 and R2 are each a reflectance of a mirror provided on an end surface of an LD chip, and L is a resonator length.

Thus, a light-extraction efficiency $\eta = \alpha_m/g = \alpha_m/(\alpha_{wg}+\alpha_m)$ can be calculated by the following equation (3).

$$\eta = \alpha_m/(\alpha_{wg} + \alpha_m) \tag{3}$$
$$= \ln(1/(R1 \times R2))/(2L \times \alpha_{wg} + \ln(1/(R1 \times R2)))$$

As is clear from the above equation (3), the light-extraction efficiency $\eta$ decreases in accordance with an increase in resonator length L. This means that the electrooptic conversion efficiency decreases in accordance with an increase in resonator length L.

The present invention has been attained in view of the above problem, and an object of the present invention is to provide an LD module in which a reliability of an LD is enhanced, without reducing electrooptic conversion efficiency.

Solution to Problem

In order to attain the above object, an LD module in accordance with an aspect of the present invention includes: a multi-mode laser diode, including an active layer, which emits a laser beam from an exit end surface; a multi-mode fiber, including a core, whose entrance end surface the laser beam enters; and an optical system provided between the multi-mode laser diode and the multi-mode fiber, the LD module being characterized in that the multi-mode laser diode has an emitter width greater than a diameter, of the core, in the entrance end surface of the multi-mode fiber, and the optical system converges the laser beam so that a diameter, of the laser beam, in the entrance end surface of the multi-mode fiber becomes smaller than the diameter, of the core, in the entrance end surface of the multi-mode fiber.

Advantageous Effects of Invention

The present invention makes it possible to provide an LD module in which a reliability of an LD is enhanced, without reducing efficiency in coupling the LD with an optical fiber.

DESCRIPTION OF EMBODIMENTS

The following description will discuss, with reference to the drawings, some embodiments of an LD (laser diode, semiconductor laser element) module in accordance with the present invention.

[Embodiment 1]

An LD module 1 in accordance with Embodiment 1 of the present invention will be discussed below with reference to FIG. 1. (a) of FIG. 1 is a plan view of the LD module 1, (b) of FIG. 1 is a lateral view of the LD module 1, (c) of FIG. 1 is a sectional view of the LD module 1 which view is taken along a line A-A', and (d) of FIG. 1 is a sectional view of the LD module 1 which view is taken along a line B-B'.

Figure 1:
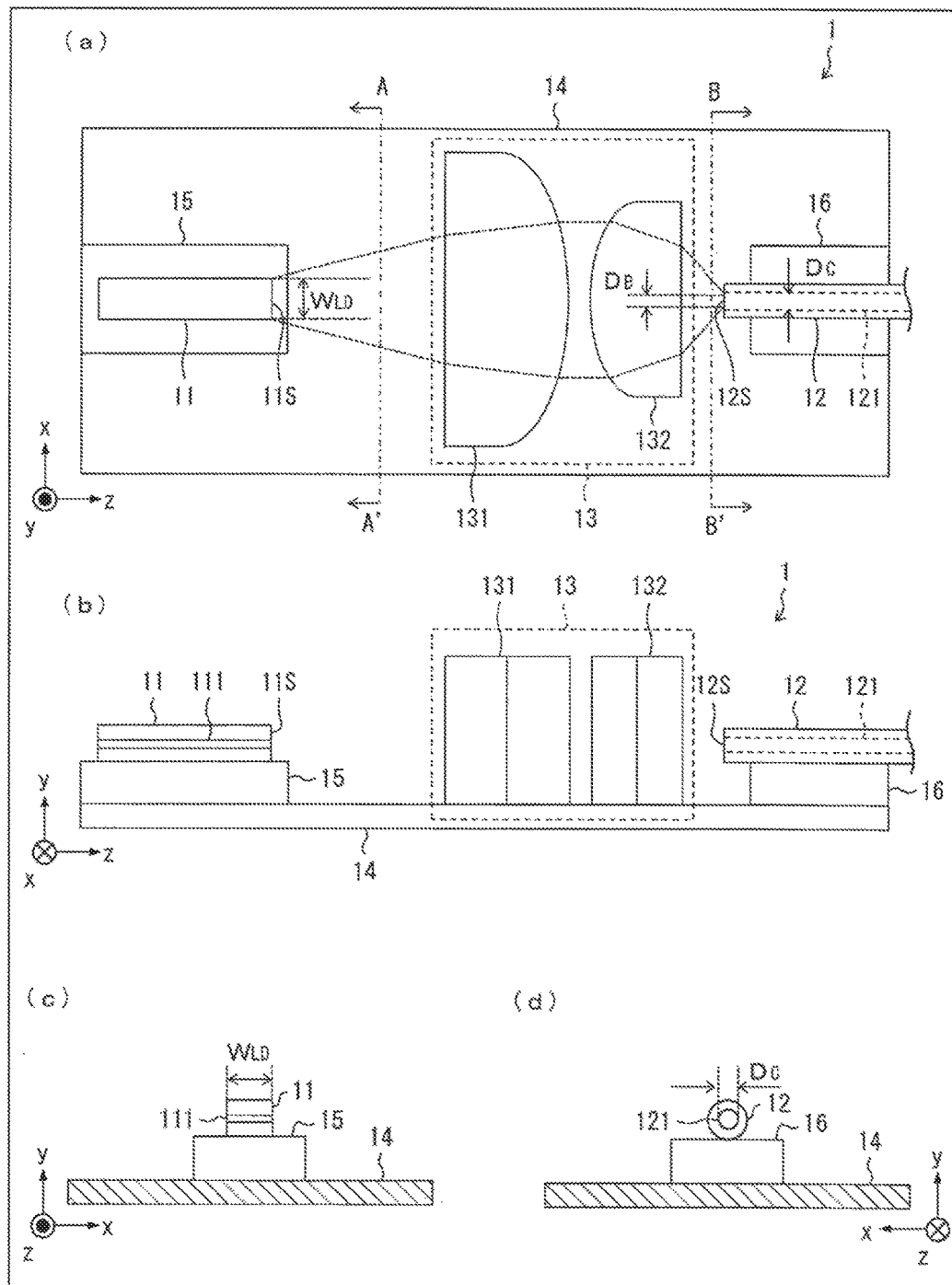
FIG. 1 is a view illustrating an LD module in accordance with Embodiment 1 of the present invention. (a) of FIG. 1 is a plan view of the LD module, (b) of FIG. 1 is a lateral view of the LD module, (c) of FIG. 1 is a sectional view of the LD module which view is taken along a line A-A', and (d) of FIG. 1 is a sectional view of the LD module which view is taken along a line B-B'.

As illustrated in FIG. 1, the LD module 1 includes an LD 11, an optical fiber 12, an optical system 13, a base plate 14, an LD mounting 15, and a fiber mounting 16.

The LD 11 is a multi-mode laser diode which includes (i) an active layer 111 and (ii) two cladding layers between which the active layer 111 is sandwiched. The multi-mode laser diode refers to a laser diode having a plurality of transverse modes. A laser beam, generated in the LD 11, exits the LD 11 via an end surface of the active layer 111, which end surface is a part of an end surface 11S of the LD 11. In the present specification, the end surface 11S is also referred to as an "exit end surface." Embodiment 1 is assumed to employ, as the LD 11, a multi-mode laser diode whose emitter width, i.e., whose active layer width $W_{LD}$ in the exit end surface 11S (i.e., a longitudinal dimension of the active layer 111) is 200 μm and whose emission angle in a horizontal direction is 5° (on one side). Embodiment 1 is assumed to particularly employ a multi-mode laser diode whose emitter width is defined by the active layer width in the exit end surface.

The optical fiber 12 is a multi-mode fiber which is composed of (i) a core 121 and (ii) a cladding which surrounds the core 121. The multi-mode fiber refers to an optical fiber having a plurality of propagation modes. A laser beam, emitted from the LD 11, enters the optical fiber 12 via an end surface of the core 121, which end surface is a part of an end surface 12S of the optical fiber 12. In the present specification, the end surface 12S is also referred to as an "entrance end surface". Embodiment 1 is assumed to employ, as the optical fiber 12, a multi-mode fiber whose core diameter is 105 μm and whose numerical aperture (NA) is 0.22.

Note that the number of layers included in the cladding of the optical fiber 12 is not limited to a particular number. That is, the optical fiber 12 can be (i) a single cladding fiber including a single cladding layer, (ii) a double cladding fiber including two cladding layers, or (iii) a triple cladding fiber including three cladding layers. Furthermore, the LD 11 is not limited to an LD 11 whose emitter width matches an entire width of the LD 11 (see FIG. 1). For example, the LD 11 can be configured to have an emitter width smaller than the entire width of the LD 11 by employing a buried-heterostructure or an electric-current constriction structure.

In Embodiment 1, (i) the LD 11 is provided on the LD mounting 15 provided on the base plate 14 and (ii) the optical fiber 12 is provided on the fiber mounting 16 provided on the base plate 14. Note that the optical fiber 12 is located so that a central axis of the optical fiber 12 matches an optical axis of a laser beam emitted from the LD 11.

The optical system 13 is provided between the LD 11 and the optical fiber 12 so as to converge a laser beam emitted from the LD 11. Particularly, the optical system 13 in accordance with Embodiment 1 converges a spread, in an S-axis direction, of a laser beam emitted from the LD 11. This causes a diameter $D_B$, of a laser beam, in the entrance end surface 12S of the optical fiber 12 to be smaller than a diameter $D_C$, of the core 121, in the entrance end surface 12S of the optical fiber 12.

Embodiment 1 employs, as the optical system 13, an optical system which includes (i) a collimating lens 131 and (ii) a light-converging lens 132.

The collimating lens 131 is provided for converting, into parallel light, a laser beam which is divergent light emitted from the LD 11. Embodiment 1 employs, as the collimating lens 131, a plano-convex cylindrical lens (R=6 mm) which is provided so that (i) its plane surface faces the exit end surface 11S of the LD 11 and (ii) its convex surface faces a convex surface of the light-converging lens 132. Note that the collimating lens 131, which is provided so that its axis is parallel to an F-axis direction of a laser beam emitted from the LD 11, collimates a spread, in the S-axis direction, of a laser beam. On this account, the collimating lens 131 may be sometimes referred to as an "S-axis collimating lens".

The light-converging lens 132 is provided for converting, into convergent light, a laser beam which is parallel light which has exited the collimating lens 131. Embodiment 1 employs, as the light-converging lens 132, a plano-convex cylindrical lens (R=3 mm) which is provided so that (i) its convex surface faces the convex surface of the collimating lens 131 and (ii) its plane surface faces the entrance end surface 12S of the optical fiber 12. Note that the light-converging lens 132, which is provided so that its axis is parallel to the F-axis direction of a laser beam which has exited the collimating lens 131, converges a spread, in the S-axis direction, of the laser beam. On this account, the light-converging lens 132 may be sometimes referred to as an "S-axis light-converging lens."

A remarkable point of the LD module 1 resides in that the emitter width of the LD 11, i.e., the dimension $W_{LD}$ (dimension in the longitudinal direction), of the active layer 111, in the exit end surface 11S (see (c) of FIG. 1) is greater than the diameter $D_C$, of the core 121, in the entrance end surface 12S of the optical fiber 12 (see (d) of FIG. 1). This causes a reduction in light density in the exit end surface 11S of the LD 11, and ultimately causes an enhancement in reliability (i.e., a reduction in failure rate) of the LD 11. Furthermore, the above configuration eliminates the need for increasing a resonator length of the LD 11, and thus does not cause a problem of decreasing the electrooptic conversion efficiency of the LD 11. Furthermore, a function of the optical system 13 allows almost all laser beams emitted from the LD 11 to enter the core 121 of the optical fiber 12, and thus does not cause a problem of decreasing the efficiency in coupling the LD 11 with the optical fiber 12.

Note that Embodiment 1 assumes that a laser beam, emitted from the LD 11, has a sufficiently small spread in the F-axis direction. Such a sufficiently small spread is therefore ignored in the present specification. The optical system 13 simply needs to include an F-axis collimating lens and/or an F-axis light-converging lens, as with later described embodiments, in a case where (i) a laser beam, emitted from the LD 11, has a large spread in the F-axis direction and/or (ii) a length of an optical path, extending from the exit end surface 11S of the LD 11 to the entrance end surface 12S of the optical fiber 12, is long.

[Embodiment 2]

Figure 2:
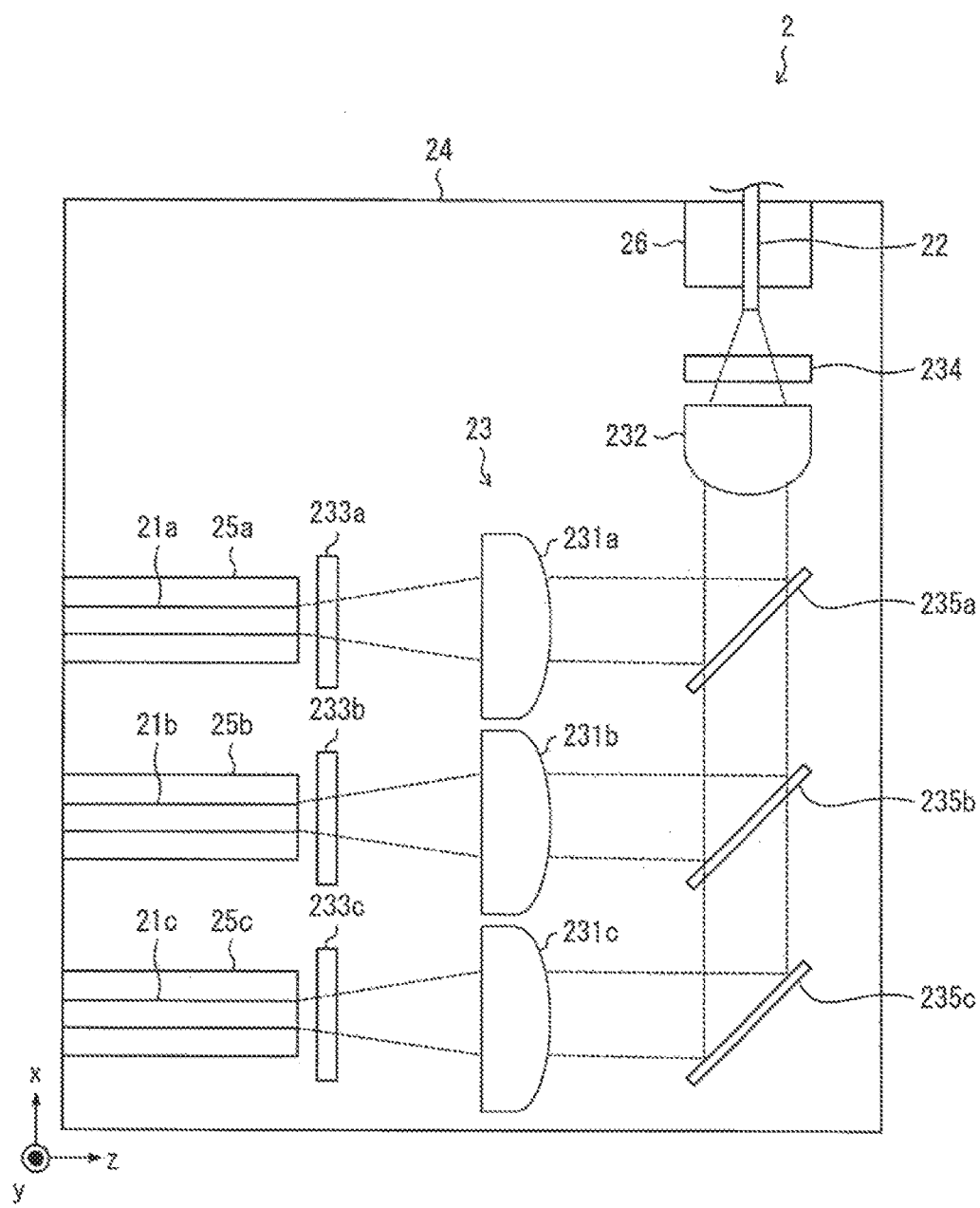
FIG. 2 is a plan view of an LD module in accordance with Embodiment 2 of the present invention.

An LD module 2 in accordance with Embodiment 2 of the present invention will be discussed below with reference to FIG. 2. FIG. 2 is a plan view of the LD module 2.

As illustrated in FIG. 2, the LD module 2 includes three LDs 21a through 21c, an optical fiber 22, an optical system 23, a base plate 24, three LD mountings 25a through 25c, and a fiber mounting 26.

As with the LD 11 in accordance with Embodiment 1, a first LD 21a is a multi-mode laser diode which includes (i) an active layer and (ii) two cladding layers between which the active layer is sandwiched. A laser beam generated in the first LD 21a exits the first LD 21a via an end surface of the active layer, which end surface is a part of an exit end surface of the first LD 21a. The same applies to each of a second LD 21b and a third LD 21c.

As with the optical fiber 12 in accordance with Embodiment 1, the optical fiber 22 is a multi-mode fiber which includes (i) a core and (ii) a cladding which surrounds the core. Each of laser beams emitted from a corresponding one of the three LDs 21a through 21c enters the optical fiber 22 via an end surface of the core, which end surface is a part of an entrance end surface of the optical fiber 22.

In Embodiment 2, (i) the three LDs 21a through 21c are provided on the three LD mountings 25a through 25c, provided on the base plate 24, respectively and (ii) the optical fiber 22 is provided on the fiber mounting 26 provided on the base plate 24. Note that (i) the three LDs 21a through 21c are provided so that optical axes of laser beams emitted from the respective three LDs 21a through 21c are parallel to each other and (ii) the optical fiber 22 is provided so that its central axis is orthogonal to each of the optical axes of the laser beams emitted from the respective three LDs 21a through 21c.

The optical system 23 is provided between the three LDs 21a through 21c and the optical fiber 22 so as to converge laser beams emitted from the respective three LDs 21a through 21c. Particularly, the optical system 23 in accordance with Embodiment 2 converges spreads, in an S-axis direction and an F-axis direction, of laser beams emitted from the respective three LDs 21a through 21c. This causes a diameter, of a laser beam, in an entrance end surface 22S of the optical fiber 22 to be smaller than a diameter, of a core 221, in the entrance end surface 22S of the optical fiber 22.

Embodiment 2 employs, as the optical system 23, an optical system which includes (i) three S-axis collimating lenses 231a through 231c, (ii) an S-axis light-converging lens 232, (iii) three F-axis collimating lenses 233a through 233c, (iv) an F-axis light-converging lens 234, and (v) three mirrors 235a through 235c.

A lens group, composed of a first F-axis collimating lens 233a and a first S-axis collimating lens 231a, is provided for converting, into parallel light, a laser beam which is divergent light emitted from the first LD 21a. Embodiment 2 employs, as the first F-axis collimating lens 233a, a plano-convex cylindrical lens which is provided so that (i) its plane surface faces the exit end surface of the first LD 21a and (ii) its convex surface faces a plane surface of the first S-axis collimating lens 231a. Embodiment 2 employs, as the first S-axis collimating lens 231a, a plano-convex cylindrical lens which is provided so that (i) its plane surface faces the convex surface of the first F-axis collimating lens 233a and (ii) its convex surface faces a reflective surface of a first mirror 235a. The same applies to each of (i) a lens group composed of a second F-axis collimating lens 233b and a second S-axis collimating lens 231b and (ii) a lens group composed of a third F-axis collimating lens 233c and a third S-axis collimating lens 231c.

The first mirror 235a is configured to reflect and guide, to the S-axis light-converging lens 232, a laser beam which has exited the first S-axis collimating lens 231a. Note, however, that the first mirror 235a transmits light (e.g., a laser beam reflected by a second mirror 235b and a laser beam reflected by a third mirror 235c) which has entered a side opposite to a side which a laser beam, which has exited the first S-axis collimating lens 231a, enters. The same applies to each of the second mirror 235b and the third mirror 235c.

A lens group, composed of the S-axis light-converging lens 232 and the F-axis light-converging lens 234, is provided for converting, into converged light, laser beams which are parallel light reflected by the respective three mirrors 235a through 235c. Embodiment 2 employs, as the S-axis light-converging lens 232, a plano-convex cylindrical lens which is provided so that (i) its convex surface faces a reflective surface of each of the three mirrors 235a through 235c and (ii) its plane surface faces a convex surface of the F-axis light-converging lens 234. Embodiment 2 employs, as the F-axis light-converging lens 234, a plano-convex cylindrical lens which is provided so that (i) its convex surface faces the plane surface of the S-axis light-converging lens 232 and (ii) its plane surface faces the entrance end surface of the optical fiber 22.

In the LD module 2, an emitter width of each of the three LDs 21a through 21c is greater than a diameter, of a core, in the entrance end surface of the optical fiber 22. This causes a reduction in light density in an exit end surface of each of the three LDs 21a through 21c, and ultimately causes an enhancement in reliability (i.e., a reduction in failure rate) of each of the three LDs 21a through 21c. Furthermore, a function of the optical system allows almost all laser beams emitted from the respective three LDs 21a through 21c to enter the core of the optical fiber 22, and thus does not cause a problem of decreasing the efficiency in coupling each of the three LDs 21a through 21c with the optical fiber 22.

Embodiment 2 is not limited to the above configuration, in which the independent three LDs 21a through 21c are employed as a light source. Alternatively, Embodiment 2 can employ a configuration in which an LD bar, in which the three LDs 21a through 21c are integrated with each other, is employed as a light source. In a case where such an LD bar is employed as a light source, it is possible to design each of the three LDs 21a through 21c to have a small aberration. This consequently makes it possible to realize a high-output LD module which is more highly reliable.

[Embodiment 3]

Figure 3:
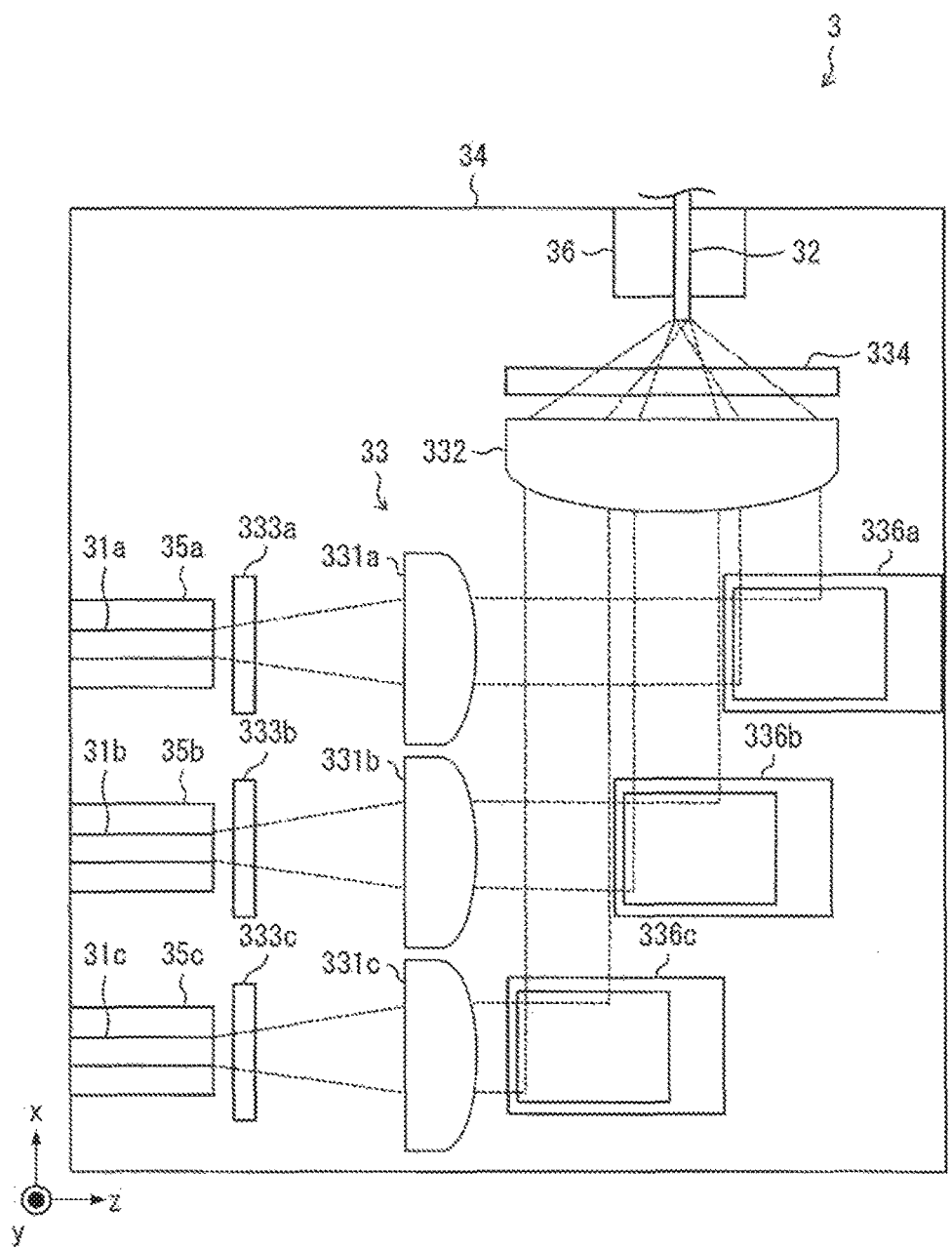
FIG. 3 is a plan view of an LD module in accordance with Embodiment 3 of the present invention.

An LD module 3 in accordance with Embodiment 3 of the present invention will be discussed below with reference to FIG. 3. FIG. 3 is a plan view of an LD module 3.

As illustrated in FIG. 3, the LD module 3 includes three LDs 31a through 31c, an optical fiber 32, an optical system 33, a base plate 34, three LD mountings 35a through 35c, and a fiber mounting 36.

As with the LD 11 in accordance with Embodiment 1, a first LD 31a is a multi-mode laser diode which includes (i) an active layer and (ii) two cladding layers between which the active layer is sandwiched. A laser beam generated in the first LD 31a exits the first LD 31a via an end surface of the active layer, which end surface is a part of an exit end surface of the first LD 31*a*. The same applies to each of a second LD 31*b* and a third LD 31*c*.

As with the optical fiber 12 in accordance with Embodiment 1, the optical fiber 32 is a multi-mode fiber which includes (i) a core and (ii) a cladding which surrounds the core. Laser beams emitted from the respective three LDs 31*a* through 31*c* enter the optical fiber 32 via an end surface of the core, which end surface is a part of an entrance end surface of the optical fiber 32.

In Embodiment 3, (i) the three LDs 31*a* through 31*c* are provided on the three LD mountings 35*a* through 35*c*, provided on the base plate 34, respectively and (ii) the optical fiber 32 is provided on the fiber mounting 36 provided on the base plate 34. Note that (i) the three LDs 31*a* through 31*c* are provided so that optical axes of laser beams emitted from the respective three LDs 31*a* through 31*c* are parallel to each other and (ii) the optical fiber 32 is provided so that its central axis is orthogonal to each of the optical axes of laser beams emitted from the respective three LDs 31*a* through 31*c*.

The optical system 33 is provided between the three LDs 31*a* through 31*c* and the optical fiber 32 so as to converge laser beams emitted from the respective three LDs 31*a* through 31*c*. Particularly, the optical system 33 in accordance with Embodiment 3 converges spreads, in an S-axis direction and an F-axis direction, of laser beams emitted from the respective three LDs 31*a* through 31*c*. This causes a diameter, of a laser beam, in an entrance end surface 32S of the optical fiber 32 to be smaller than a diameter, of a core 331, in the entrance end surface 32S of the optical fiber 32.

Embodiment 3 employs, as the optical system 33, an optical system which includes (i) three S-axis collimating lenses 331*a* through 331*c*, (ii) an S-axis light-converging lens 332, (iii) three F-axis collimating lenses 333*a* through 333*c*, (iv) an F-axis light-converging lens 334, and (v) three double mirrors 336*a* through 336*c*.

A lens group, composed of a first F-axis collimating lens 333*a* and a first S-axis collimating lens 331*a*, is provided for converting, into parallel light, a laser beam which is divergent light emitted from the first LD 31*a*. Embodiment 3 employs, as the first F-axis collimating lens 333*a*, a plano-convex cylindrical lens which is provided so that (i) its plane surface faces the exit end surface of the first LD 31*a* and (ii) its convex surface faces a plane surface of the first S-axis collimating lens 331*a*. Embodiment 3 employs, as the first S-axis collimating lens 331*a*, a plano-convex cylindrical lens which is provided so that (i) its plane surface faces the convex surface of first F-axis collimating lens 333*a* and (ii) its convex surface faces a first reflective surface S1 (later described) of a first double mirror 336*a*. The same applies to each of (i) a lens group composed of a second F-axis collimating lens 333*b* and a second S-axis collimating lens 331*b* and (ii) a lens group composed of a third F-axis collimating lens 333*c* and a third S-axis collimating lens 331*c*.

The first double mirror 336*a* is configured to reflect and guide, to the S-axis light-converging lens 332, a laser beam which has exited the first S-axis collimating lens 331*a*. The same applies to each of a second double mirror 336*b* and a third double mirror 336*c*. Note that configurations of the respective three double mirrors 336*a* through 336*c* will be later discussed with reference to drawings.

A lens group, composed of the S-axis light-converging lens 332 and the F-axis light-converging lens 334, is provided for (i) converting, into convergent light, laser beams which are parallel light reflected from the respective three double mirrors 336*a* through 336*c*, and (ii) converting, into a single laser beam, the laser beams thus converted into convergent light. Embodiment 3 employs, as the S-axis light-converging lens 332, a plano-convex cylindrical lens which is provided so that (i) its convex surface faces a second reflective surface S2 (later described) of each of the three double mirrors 336*a* through 336*c* and (ii) its plane surface faces a convex surface of the F-axis light-converging lens 334. Embodiment 3 employs, as the F-axis light-converging lens 334, a plano-convex cylindrical lens which is provided so that (i) its convex surface faces the plane surface of the S-axis light-converging lens 332 and (ii) its plane surface faces the entrance end surface of the optical fiber 32.

In the LD module 3, an emitter width of each of the three LDs 31*a* through 31*c* is greater than a diameter, of the core, in the entrance end surface of the optical fiber 32. This causes a reduction in light density in an exit end surface of each of the three LDs 31*a* through 31*c*, and ultimately causes an enhancement in reliability (i.e., a reduction in failure rate) of each of the three LDs 31*a* through 31*c*. Furthermore, a function of the optical system allows almost all laser beams emitted from the respective three LDs 31*a* through 31*c* to enter the core of the optical fiber 32, and thus does not cause a problem of decreasing the efficiency in coupling each of the three LDs 31*a* through 31*c* with the optical fiber 32.

Figure 4:
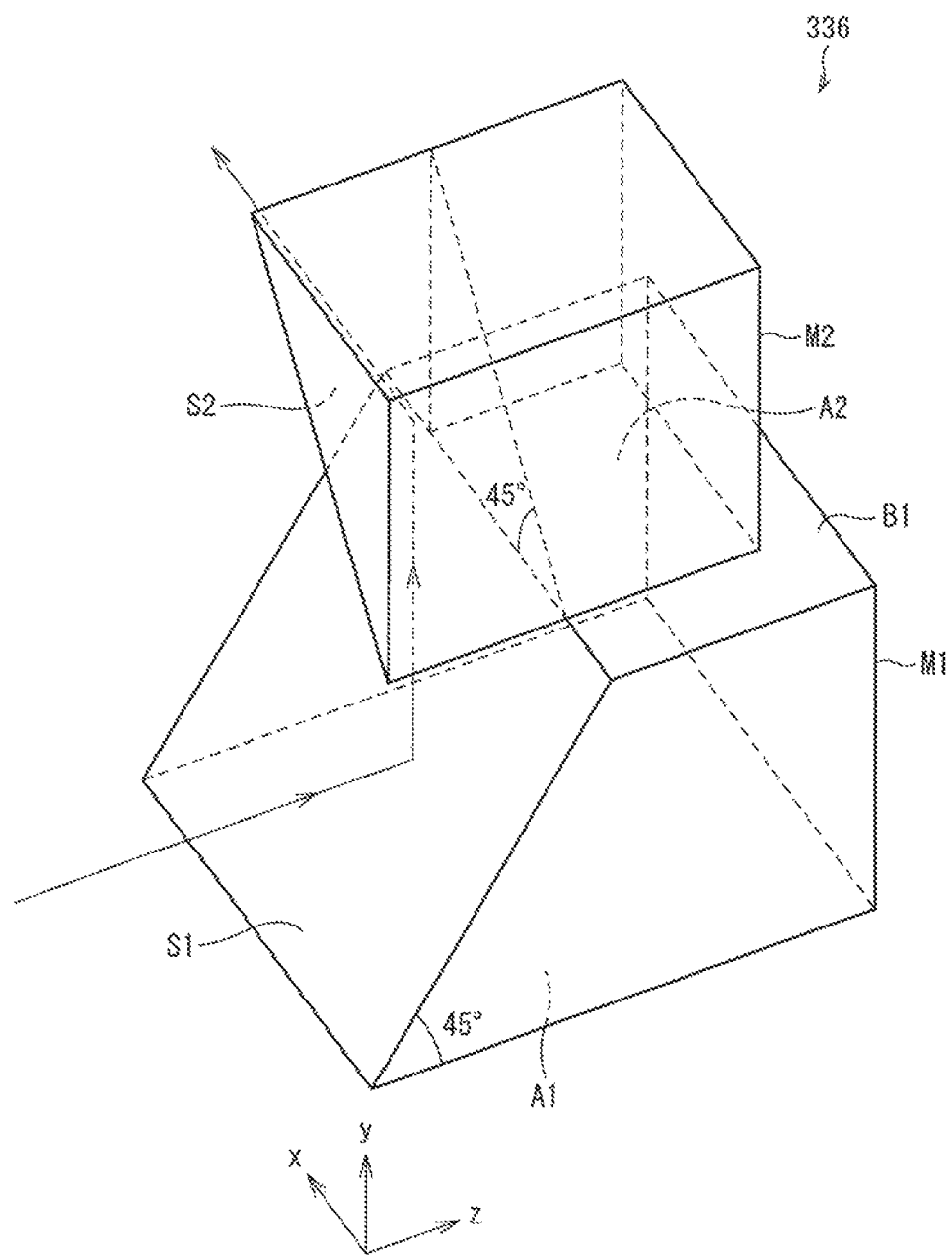
FIG. 4 is a perspective view of a double mirror included in the LD module illustrated in FIG. 3.

The following description will supplement the configurations of the respective three double mirrors 336*a* through 336*c* with reference to FIG. 4. FIG. 4 is a perspective view of a double mirror 336 which represents the three double mirrors 336*a* through 336*c*.

As illustrated in FIG. 4, the double mirror 336 is constituted by a first mirror M1 and a second mirror M2.

The first mirror M1 is a polyhedral structure (e.g., prism) that has a bottom surface A1, a top surface B1 parallel to the bottom surface A1, and a first reflective surface S1. The first reflective surface S1 and the bottom surface A1 makes an angle of 45°, as illustrated in FIG. 4.

The first mirror M1 is provided on the base plate 34 so that the bottom surface A1 abuts a top surface of the base plate 34. As a result, a normal vector of the first reflective surface S1 of the first mirror M1 (an outward normal vector pointing toward outside the first mirror M1 from the first reflective surface S1) and a normal vector of the top surface (zx plane) of the base plate 34 (an outward normal vector pointing toward outside the base plate 34 from the top surface of the base plate 34) makes an angle of 45°. Further, an orientation of the first mirror M1 is determined so that a normal of the first reflective surface S1 becomes parallel to a yz plane. As a result, the first reflective surface S1 of the first mirror M1 reflects a laser beam entered from the z-axis negative direction into the y-axis positive direction.

The second mirror M2 is a polyhedral structure (e.g., prism) that has at least a second bottom surface A2 and a reflective surface S2. The second reflective surface S2 and the bottom surface A2 makes an angle of 45° as illustrated in FIG. 4.

The second mirror M2 is provided on the first mirror M1 so that the bottom surface A2 abuts the top surface B1 of the first mirror M1. As a result, a normal vector of the second reflective surface S2 of the second mirror M2 (an outward normal vector pointing toward outside the second mirror M2 from the second reflective surface S2) and the normal vector of the top surface (zx plane) of the base plate 34 (an outward normal vector pointing toward outside the base plate 34 from the top surface of the base plate B) makes an angle of 135°. Further, an orientation of the second mirror M2 is determined so that a normal of the second reflective surface S2 becomes parallel to an xy plane. As a result, the second reflective surface S2 of the second mirror M2 reflects a laser beam entered from a y-axis negative direction into the x-axis negative direction.

The LD module 3 allows a propagation direction of an output beam (a laser beam which has been reflected by the first mirror M1 and the second mirror M2 in this order) to coincide with the x-axis negative direction, by adjusting the orientations of the first mirror M1 and the second mirror M2 that constitute each of the three double mirrors 336a through 336c. This is because minute rotation of the first mirror M1 around the y axis as a rotation axis causes minute rotation of the propagation direction of the output beam and minute rotation of the second mirror M2 around the y axis as a rotation axis causes minute rotation of the propagation direction of the output beam.

Further, in the LD module 3, optical axes of output beams can be aligned at equal intervals within a plane parallel to the xz plane, by adjusting positions of the first mirror M1 and the second mirror M2 that constitute each of the double mirrors 336a through 336c. This is for the following reason: when the first mirror M1 is translated in the z-axis positive direction or in the z-axis negative direction, the optical axes of the output beams are translated in the z-axis positive direction or in the z-axis negative direction; and when the second mirror M2 is translated in the x-axis positive direction or in the x-axis negative direction, the optical axes of the output beams are translated in the y-axis positive direction or in the y-axis negative direction.

Note that in Embodiment 3, a first aim of such adjustment is to make propagation directions of the output beams constituting the output beam bundle coincide with the x-axis negative direction. However, the present invention is not limited as such. In other words, it is sufficient if it is possible to make the propagation directions of the output beams constituting the output beam coincide with a certain direction and this certain direction is not limited to the x-axis negative direction.

Further, in Embodiment 3, a second aim of such adjustment is to align optical axes of the output beams constituting the output beam bundle at equal intervals in a plane parallel to the zx plane. However, the present invention is not limited as such. In other words, it is sufficient if it is possible to align the optical axes of the output beams constituting the output beam bundle at equal intervals in a certain plane and this certain plane is not limited to the plane parallel to the zx plane.

Note that, in a case where an integrated mirror, in which the first mirror M1 is integrated with the second mirror M2, is employed instead of the double mirror 336, it is necessary to incline the entire integrated mirror so that a laser beam, reflected by the second mirror M2, propagates in an intended direction. This causes an adhesive layer, which is provided to fix the integrated mirror to the base plate 34, to become non-uniform in thickness. Consequently, the thickness of the adhesive layer non-uniformly changes in accordance with a change in environment such as temperature and/or humidity. This causes a change in inclination of the integrated mirror, and ultimately causes the propagation direction of the laser beam, reflected by the second mirror M2, to be deviated from the intended direction. In a case where the integrated mirror, in which the first mirror M1 is integrated with the second mirror M2, is employed instead of the double mirror 336, the problem will occur that the propagation direction of the laser beam reflected by the second mirror M2 changes in accordance with environment. In contrast, in a case of employing the double mirror 336 in which the second mirror M2 is provided on the first mirror M1, it is unnecessary to incline the entire double mirror 336 so that the laser beam, reflected by the second mirror M2, propagates in the intended direction. Therefore, the problem will not occur that the propagation direction of the laser beam reflected by the second mirror M2 changes in accordance with environment.

[Suitable Emitter Width in Exit End Surface of LD]

Lastly, a suitable emitter width (i.e., a width, of an active layer, in an exit end surface) of each of LDs 11, 21a through 21c, and 31a through 31c (hereinafter referred to simply as an "LD"), included in corresponding ones of the LD modules 1, 2, and 3, will be discussed below with reference to FIG. 5.

Figure 5:
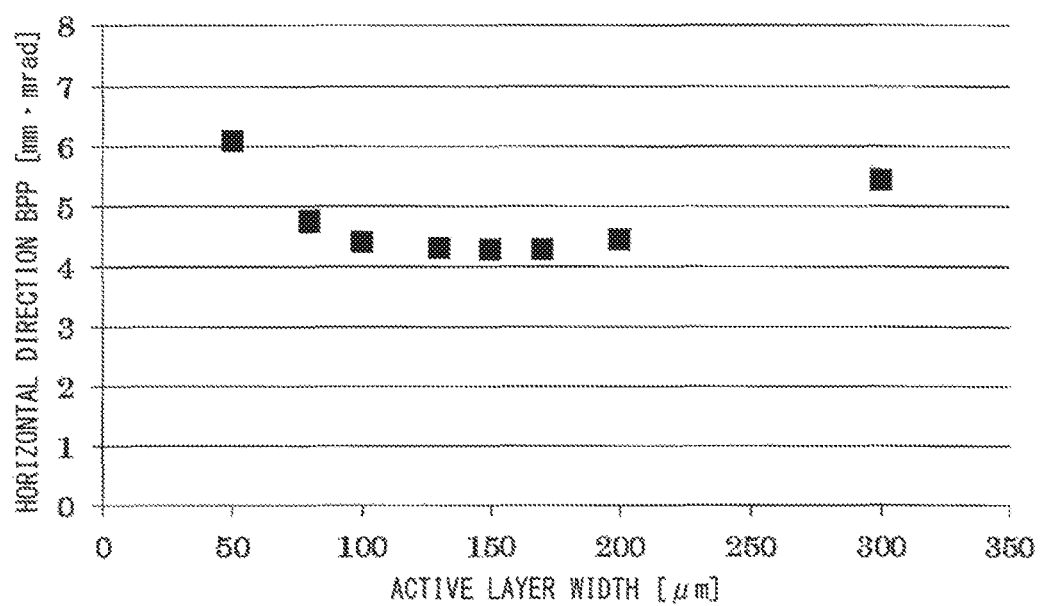
FIG. 5 is a graph illustrating how a beam parameter product (BPP) of a laser beam, emitted from an LD, changes in accordance with an emitter width of the LD of each of the LD modules of respective Embodiments 1 through 3 of the present invention.

FIG. 5 is a graph illustrating how a beam parameter product (BPP) of a laser beam, emitted from the LD, changes in accordance with an emitter width of the LD under the condition that optical output power is constant. Note that the beam parameter product refers to an index of a beam quality. The index is defined by a product of (i) a radius of a beam waist and (ii) a half width, at half maximum, of a beam divergence angle.

As illustrated in FIG. 5, the beam parameter product of the laser beam, emitted from the LD, changes in accordance with the emitter width of the LD. In an example illustrated in FIG. 5, the beam parameter product shows a local minimal value when the LD has an emitter width of 150 μm.

The emitter width of the LD is preferably set such that the beam parameter product of the laser beam emitted from the LD (alternatively a beam parameter product of a laser beam which has been emitted from the LD and has then been transmitted by the optical system 13, 23, or 33) is equal to or smaller than that of a corresponding one of the optical fibers 12, 22, and 32 (hereinafter referred to simply as an "optical fiber"). The emitter width of the LD is more preferably set such that the beam parameter product of the laser beam emitted from the LD is substantially $(1/2)^{1/2}$ times that of the optical fiber. Note that the beam parameter product of the optical fiber refers to a maximum beam parameter product of a laser beam which the optical fiber can receive without loss (i.e., a maximum beam parameter product of a laser beam which can be confined to a core of the optical fiber). That is, the optical fiber can receive, without loss, a laser beam whose beam parameter product is equal to or smaller than that of the optical fiber. It follows that the optical fiber cannot receive, without loss, a laser beam whose beam parameter product is greater than that of the optical fiber.

The following description will discuss why the beam parameter product of the laser beam, emitted from the LD, is preferably substantially $(1/2)^{1/2}$ times that of the optical fiber.

In order for the optical fiber to receive a laser beam without omission, it is essential that (i) an incident position, of the laser beam, in an entrance end surface of the optical fiber fall within the core of the optical fiber and (ii) an incident angle, of the laser beam, in the entrance end surface of the optical fiber be equal to or smaller than a maximum light-reception angle of the optical fiber. In other words, it is essential that (i) the incident position, of the laser beam, in the entrance end surface of the optical fiber be distributed within a circular region (hereinafter referred to as a "light-receivable circle in a position space"), in the position space, whose diameter is equal to that of the core of the optical fiber and (ii) the incident angle, of the laser beam, in the entrance end surface of the optical fiber be distributed within a circular region (hereinafter referred to as a "light-receivable circle in an angle space"), in the angle space, whose diameter is equal to the maximum light-reception angle of the optical fiber.

In the angle space, the incident angle, of the laser beam, in the entrance end surface of the optical fiber is distributed within a rectangular region (i) whose long side corresponds to the divergence angle, in an F-axis direction, of the laser beam and (ii) whose short side corresponds to the divergence angle, in an S-axis direction, of the laser beam. Thus, in order to meet the above condition (ii), it is essential that the rectangular region fall within the light-receivable circle in the angle space, i.e., diagonal lines of the rectangular region be equal to or shorter than a diameter, in the angle space, of the light-receivable circle (i.e., the maximum light-reception angle of the optical fiber).

In order to (i) meet the above conditions and (ii) maximize an area of the rectangular region which represents the incident angle of the laser beam, i.e., fully utilize the light-receivable circle in the angle space, it is necessary and sufficient that the rectangular region be a square inscribed in the light-receivable circle, i.e., diagonal lines of the rectangular region be equal to the diameter, in the angle space, of the light-receivable circle. This means that divergence angles, in the F-axis and S-axis directions, of the laser beam is $(½)^{1/2}$ times a maximum incident angle of the optical fiber. Particularly in a case where a diameter of a beam waist of the laser beam is equal to that of the core of the optical fiber, the beam parameter product, in the F-axis and S-axis directions, of the laser beam is $(½)^{1/2}$ times that of the optical fiber.

Therefore, in a case where the beam parameter product of the laser beam emitted from the LD (i.e., a laser beam emitted from an LD driven by a rated electric current) is substantially $(½)^{1/2}$ times that of the optical fiber, it is possible to (i) cause the optical fiber to receive, without omission, a laser beam emitted from the LD and (ii) almost fully utilize the light-receivable circle in the angle space.

Note that an optical system employed in such an LD module can maintain or increase the beam parameter product of the laser beam emitted from the LD, but does not reduce the beam parameter product of the laser beam emitted from the LD. In view of the facts, it is desirable that the beam parameter product, in the F-axis and S-axis directions, of the laser beam, emitted from the LD operated by a rated electric current, be equal to or smaller than $(½)^{1/2}$ times that of the optical fiber.

Note that the beam parameter product of the laser beam, emitted from the LD, can be calculated based on physical values of the LD by use of the following equation, without measuring physical values (i.e., the radius of the beam waist and the beam divergence angle) of the laser beam emitted from the LD.

$$(dn/dT) \times Rth \times Pdis \times W$$

where (dn/dT) is a temperature differentiation of a refractive index (of a semiconductor part of the LD), Rth is a thermal resistance of a housing of the LD module which housing is in thermal contact with the LD, Pdis is an electric power consumption of the LD, and W is the emitter width of the LD, i.e., the width, of the active layer, in the exit end surface of the LD.

By using the above equation, it is possible to determine, at a design phase, the emitter width W in the exit end surface of the LD so that (1) the beam parameter product of the laser beam, emitted from the LD, be smaller than that of the optical fiber or (2) the beam parameter product of the laser beam, emitted from the LD, be equal to or smaller than $(½)^{1/2}$ times that of the optical fiber.

Note that an increase in emitter width W of the LD causes (i) an increase in the beam waist of the laser beam emitted from the LD and (ii) a reduction in the beam divergence angle of the laser beam emitted from the LD. On this account, even in a case where the emitter width W of the LD is increased, the beam parameter product of the laser beam, emitted from the LD, will never increase in proportion to the emitter width W. The reason why the beam divergence angle decreases in accordance with an increase in emitter width W is, for example, as follows. That is, (i) the electric power consumption Pdis decreases in accordance with an increase in emitter width W and (ii) the thermal resistance near the active layer decreases in accordance with an increase in emitter width W.

Therefore, even in a case where the emitter width W of the LD is increased to enhance a reliability of the LD, an efficiency in coupling the LD with the optical fiber will never significantly decrease. That is, it is possible to enhance, without sacrificing an electrooptic conversion efficiency of the LD module, the reliability of the LD by increasing the emitter width W of the LD.

[Main Points]

An LD module in accordance with an aspect of the present invention includes: a multi-mode laser diode, including an active layer, which emits a laser beam from an exit end surface; a multi-mode fiber, including a core, whose entrance end surface the laser beam enters; and an optical system provided between the multi-mode laser diode and the multi-mode fiber, the LD module being characterized in that the multi-mode laser diode has an emitter width greater than a diameter, of the core, in the entrance end surface of the multi-mode fiber, and the optical system converges the laser beam so that a diameter, of the laser beam, in the entrance end surface of the multi-mode fiber becomes smaller than the diameter, of the core, in the entrance end surface of the multi-mode fiber.

In the above configuration, the multi-mode laser diode is employed as an LD. This makes it easier to increase power output of the LD as compared with the case where a single-mode laser diode is employed as the LD. Furthermore, since the multi-mode fiber is employed as an optical fiber, it is easier to enhance an efficiency in coupling the LD with the optical fiber as compared with the case where a single-mode fiber is employed as the optical fiber.

In the above configuration, the emitter width of the multi-mode laser diode is greater than the diameter, of the core, in the entrance end surface of the multi-mode fiber. This causes a reduction in light density in the exit end surface of the multi-mode laser diode, and ultimately causes an enhancement in reliability of the multi-mode laser diode. Furthermore, in the above configuration, it is not necessary to increase a resonator length to enhance the reliability of the multi-mode laser. It is therefore possible to enhance the reliability of the multi-mode laser diode without reducing an electrooptic conversion efficiency.

In the above configuration, a function of the optical system causes the diameter, of the laser beam, in the entrance end surface of the multi-mode fiber to become smaller than the diameter, of the core, in the entrance end surface of the multi-mode fiber. This makes it possible to cause, without loss, a laser beam, which has been emitted from the multi-mode laser diode and has then been transmitted by the optical system, to enter the multi-mode fiber.

Note that, in an LD (such as a multi-mode laser diode), an increase in emitter width generally increases a threshold electric current. This decreases a power conversion efficiency (optical output/electric power consumption) in a case where a low-output LD is employed, but enhances a power conversion efficiency, due to a decrease in Joule heat, in a case where a high-output LD is employed. This can be verified by using the following equation (4) which expresses a power conversion efficiency of the LD.

$$\begin{aligned}\text{Power conversion efficiency} &= \text{Optical output}/ \\ &\quad \text{Electric power consumption} \\ &= \eta i \times (I\text{-}Ith) \times hv \times \eta / I \times (Vth + Rd \times I) \\ &= \eta i \times (J\text{-}Jth) \times hv \times S \times \eta / \\ &\quad (J \times S \times Vth + (J \times S)^2 \times \rho / S) \\ &= \eta i \times (J\text{-}Jth) \times hv \times \eta / \\ &\quad (J \times Vth + J^2 \times \rho)\end{aligned} \quad (4)$$

where $\eta i$ is an electric injection coefficient, I is a driving electric current, Ith is a threshold electric current, hv is energy of a photon, $\eta$ is light-extraction efficiency, Vth is a threshold voltage, Rd is a differential resistance, J is a density of the driving electric current, Jth is a density of the threshold electric current, and S is an effective sectional area.

That is, in a case where the light-extraction efficiency is constant and the LD is not affected by a non-linear effect, such as a reduction in electric injection coefficient due to a temperature increase of the active layer, the power conversion efficiency of the LD changes in accordance with the density of the driving electric current. Thus, in a case where two LDs to which identical optical outputs are applied are compared, an LD having a greater emitter width achieves a higher power conversion efficiency.

An LD module in accordance with an aspect of the present invention is preferably configured such that the emitter width of the multi-mode laser diode is set so that a beam parameter product of the laser beam emitted from the multi-mode laser diode is smaller than a beam parameter product of the multi-mode fiber. Furthermore, an LD module in accordance with an aspect of the present invention is more preferably configured such that the emitter width of the multi-mode laser diode is set so that the beam parameter product of the laser beam emitted from the multi-mode laser diode is smaller than $(1/2)^{1/2}$ times the beam parameter product of the multi-mode fiber.

With the above configuration, it is possible to cause, without loss, light which has been emitted from the multi-mode laser diode and has then been transmitted by the optical system to be confined to the core of the multi-mode fiber.

An LD module in accordance with an aspect of the present invention is preferably configured such that the optical system includes: a collimating lens for converting, into parallel light, the laser beam which is divergent light emitted from the multi-mode laser diode; and a light-converging lens for converting, into convergent light, the parallel light which has exited the collimating lens.

The above configuration makes it easier to realize an optical system for converging a laser beam emitted from the multi-mode laser diode.

An LD module in accordance with an aspect of the present invention is preferably configured to further include a mirror for reflecting and guiding, to the multi-mode fiber, the laser beam emitted from the multi-mode laser diode, the multi-mode fiber being provided so that a central axis of the multi-mode fiber is orthogonal to an optical axis of the laser beam emitted from the multi-mode laser diode.

The above configuration makes it possible to reduce a size of the LD module, particularly a size, in a central axis direction, of the multi-mode fiber.

An LD module in accordance with an aspect of the present invention is preferably configured such that the mirror is a double mirror including: a first mirror having a first reflective surface for reflecting the laser beam emitted from the multi-mode laser diode, the first mirror being provided on a base plate; and a second mirror having a second reflective surface for reflecting the laser beam thus reflected by the first reflective surface, the second mirror being provided on the first mirror.

The above configuration makes it possible to cause, with high accuracy, a laser beam which has been reflected by the first mirror and has then been reflected by the second mirror to propagate in an intended direction, by causing the first mirror and the second mirror to slightly rotate about a rotation axis orthogonal to the base plate. This makes it easier to enhance an efficiency in coupling the multi-mode laser diode with the multi-mode fiber. Particularly, the LD module in accordance with the above aspect employs a configuration in which a laser beam emitted from the multi-mode laser diode is more tightly collected by the optical system as compared with a conventional LD module, so that a beam waist at a light-converging point (i.e., in the entrance end surface of the multi-mode fiber) is smaller than that at a light-emitting point (i.e., in the exit end surface of the multi-mode laser diode). A mirror provided to guide the laser beam emitted from the multi-mode laser diode thus needs to be highly accurate. However, the above configuration makes it easy to satisfy such necessity.

Note that, in a case where an integrated mirror, in which the first mirror is integrated with the second mirror, is employed instead of the double mirror, it is necessary to incline the entire integrated mirror so that a laser beam, reflected by the second mirror, propagates in an intended direction. This causes an adhesive layer, which is provided to fix the integrated mirror to the base plate, to become non-uniform in thickness. Consequently, the thickness of the adhesive layer non-uniformly changes in accordance with a change in environment such as temperature and/or humidity. This causes a change in inclination of the integrated mirror, and ultimately causes the propagation direction of the laser beam, reflected by the second mirror, to be deviated from the intended direction. In a case where the integrated mirror, in which the first mirror is integrated with the second mirror, is employed instead of the double mirror, the problem will occur that the propagation direction of the laser beam reflected by the second mirror changes in accordance with environment. In contrast, in a case of employing the double mirror in which the second mirror is provided on the first mirror is employed, it is unnecessary to incline the entire double mirror so that the laser beam, reflected by the second mirror, propagates in the intended direction. Therefore, the problem will not occur that the propagation direction of the laser beam reflected by the second mirror changes in accordance with environment.

Note that the beam parameter product (hereinafter referred to as "BPP") is defined by the following equation (5).

$$BPP = \omega 0 / 2 \times \theta 0 \quad (5)$$

where ω0/2 is a radius of a beam waist and θ0 is a half width, at half maximum, of a beam divergence angle.

Note that (i) a beam waist of a laser beam emitted from the multi-mode laser diode changes in accordance with an emitter width W of the multi-mode laser diode and (ii) a beam divergence angle of the laser beam emitted from the multi-mode laser diode changes in accordance with (a) a temperature differentiation do/dT of a refractive index of a semiconductor part of the multi-mode laser diode, (b) a thermal resistance Rth of a housing of the LD module which housing is in thermal contact with the multi-mode laser diode, and (c) electric power consumption Pdis of the multi-mode laser diode. Thus, the BPP of the laser beam emitted from the multi-mode laser diode can be calculated by the following equation (6).

$$BPP \propto (dn/dT) \times Rth \times Pdis \times W/2 \qquad (6)$$

An increase in emitter width W of the multi-mode laser diode causes (i) an increase in beam waist of a laser beam emitted from the multi-mode laser diode and (ii) a reduction in beam divergence angle of the laser beam emitted from the multi-mode laser diode. That is, an increase in emitter width W of the multi-mode laser diode causes a reduction in beam divergence angle of the laser beam emitted from the multi-mode laser diode. This is because inhibition in heat generation in the active layer of the multi-mode laser diode causes a reduction in electric power consumption Pdis of the multi-mode laser diode.

An increase in emitter width W of the multi-mode laser diode does not cause the BPP of the laser beam of the multi-mode laser diode to increase in proportion to the emitter width W (see FIG. 5). That is, even in a case where the emitter width W of the multi-mode laser diode is increased, an efficiency in coupling the multi-mode laser diode with the optical fiber does not significantly decrease. As such, it is possible to cause, without sacrificing the power conversion efficiency of the entire LD module, an enhancement in reliability of the LD module by increasing the emitter width W of the multi-mode laser diode.

[Supplemental Notes]

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is suitably applicable to an LD module, particularly to an LD module which employs, as a light source, a multi-mode laser diode which achieved high output.

REFERENCE SIGNS LIST 1, 2, and 3: LD module
11, 21a through 21c, and 31a through 21c: LD (multi-mode laser diode)
11S: Exit end surface
111: Active layer
12, 22, and 32: Optical fiber (multi-mode fiber)
12S: Entrance end surface
121: Core
13, 23, and 33: Optical system
131, 231a through 231c, and 331a through 331c: S-axis collimating lens (collimating lens)
132, 232, and 332: S-axis light-converging lens (light-converging lens)
233a through 233c and 333a through 333c: F-axis collimating lens (collimating lens)
234 and 334: F-axis light-converging lens (light-converging lens)
336a through 336c and 336: Double mirror

The invention claimed is:

1. An LD module, comprising:
a multi-mode laser diode, including an active layer, which emits a laser beam from an exit end surface;
a multi-mode fiber, including a core, whose entrance end surface the laser beam enters; and
an optical system provided between the multi-mode laser diode and the multi-mode fiber,
the optical system including:
a collimating lens configured to refract, within a plane parallel to the active layer, the laser beam which is divergent light emitted from the multi-mode laser diode so as to convert the laser beam into parallel light; and
a light-converging lens configured to convert, into convergent light, the parallel light which has exited the collimating lens,
the multi-mode laser diode having an emitter width greater than a diameter, of the core, in the entrance end surface of the multi-mode fiber,
the optical system being configured to converge the laser beam so that a diameter, of the laser beam, in the entrance end surface of the multi-mode fiber becomes smaller than the diameter, of the core, in the entrance end surface of the multi-mode fiber,
the multi-mode laser diode being configured so that a beam parameter product of the laser beam emitted from the multi-mode laser diode shows a local minimal value which changes in accordance with the emitter width of the multi-mode laser diode, the local minimal value being equal to or smaller than a beam parameter product of the multi-mode fiber,
the emitter width of the multi-mode laser diode being set so that the beam parameter product of the laser beam emitted from the multi-mode laser diode is equal to or smaller than the beam parameter product of the multi-mode fiber, the LD module further comprising:
a mirror configured to reflect and guide, to the multi-mode fiber, a laser beam emitted from the multi-mode laser diode,
the multi-mode fiber being provided so that a central axis of the multi-mode fiber is orthogonal to an optical axis of the laser beam emitted from the multi-mode laser diode.

2. The LD module as set forth in claim 1, wherein:
the emitter width is set so that the beam parameter product of the laser beam emitted from the multi-mode laser diode is equal to the local minimal value.

3. The LD module as set forth in claim 1, wherein:
the emitter width of the multi-mode laser diode is set so that the beam parameter product of the laser beam emitted from the multi-mode laser diode is substantially $(1/2)^{1/2}$ times the beam parameter product of the multi-mode fiber.

4. The LD module as set forth in claim 1, wherein the mirror is a double mirror including:
a first mirror having a first reflective surface configured to reflect the laser beam emitted from the multi-mode laser diode, the first mirror being provided on a base plate; and a second mirror having a second reflective surface configured to reflect the laser beam thus reflected by the first reflective surface, the second mirror being provided on the first mirror.

5. An LD module, comprising:
a multi-mode laser diode, including an active layer, which has a transverse mode and emits a laser beam from an exit end surface;
a multi-mode fiber, including a core, whose entrance end surface the laser beam enters; and
an optical system provided between the multi-mode laser diode and the multi-mode fiber,
said LD module being characterized in that
the optical system includes:
  a collimating lens for refracting, within a plane parallel to the active layer, the laser beam which is divergent light emitted from the multi-mode laser diode so as to convert the laser beam into parallel light; and
  a light-converging lens for converting, into convergent light, the parallel light which has exited from the collimating lens,
the multi-mode laser diode has an emitter width greater than a diameter, of the core, in the entrance end surface of the multi-mode fiber,
the optical system converges the laser beam so that a diameter, of the laser beam, in the entrance end surface of the multi-mode fiber becomes smaller than the diameter, of the core, in the entrance end surface of the multi-mode fiber,
the multi-mode laser diode is configured so that a beam parameter product of the laser beam emitted from the multi-mode laser diode when optical output power is constant shows a local minimum value which changes in accordance with the emitter width of the multi-mode laser diode, the local minimal value being equal to or smaller than a beam parameter product of the multi-mode fiber, and the emitter width of the multi-mode laser diode is set so that the beam parameter product of the laser beam emitted from the multi-mode laser diode is equal to or smaller than the beam parameter product of the multi-mode fiber.

6. The LD module as set forth in claim 5, wherein:
the emitter width is set so that the beam parameter product of the laser beam emitted from the multi-mode laser diode is equal to the local minimal value.

7. The LD module as set forth in claim 5, wherein:
the emitter width of the multi-mode laser diode is set so that the beam parameter product of the laser beam emitted from the multi-mode laser diode is substantially $(\frac{1}{2})^{1/2}$ times the beam parameter product of the multi-mode fiber.

8. The LD module as set forth in claim 5, further comprising:
a mirror configured to reflect and guide, to the multi-mode fiber, a laser beam emitted from the multi-mode laser diode,
the multi-mode fiber being provided so that a central axis of the multi-mode fiber is orthogonal to an optical axis of the laser beam emitted from the multi-mode laser diode.

9. The LD module as set forth in claim 8, wherein the mirror is a double mirror including:
a first mirror having a first reflective surface configured to reflect the laser beam emitted from the multi-mode laser diode, the first mirror being provided on a base plate; and
a second mirror having a second reflective surface configured to reflect the laser beam thus reflected by the first reflective surface, the second mirror being provided on the first mirror.

* * * * *